(12) United States Patent
Abe (10) Patent No.: US 6,521,920 B2
(45) Date of Patent: Feb. 18, 2003

(54) SOLID STATE IMAGE SENSOR

(75) Inventor: Hideshi Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/750,005

(22) Filed: Dec. 27, 2000

(65) Prior Publication Data

US 2001/0006237 A1 Jul. 5, 2001

(30) Foreign Application Priority Data

Dec. 27, 1999 (JP) ............................................ 11-370371

(51) Int. Cl.⁷ ...................... H01L 27/148; H01L 29/768
(52) U.S. Cl. ...................... 257/223; 257/230; 257/233; 257/432; 257/435
(58) Field of Search ................................ 257/223, 222, 257/230, 232, 233

(56) References Cited

U.S. PATENT DOCUMENTS

| 4,672,455 A | * | 6/1987 | Miyatake ..................... 257/223 |
| 5,191,399 A | * | 3/1993 | Maegawa et al. ........... 257/223 |
| 5,446,297 A | * | 8/1995 | Lee .............................. 257/223 |
| 5,514,887 A | * | 5/1996 | Hokari ........................ 257/223 |
| 5,903,021 A | * | 5/1999 | Lee et al. .................... 257/292 |

* cited by examiner

Primary Examiner—Gene M. Munson
(74) Attorney, Agent, or Firm—Sonnenschein, Nath & Rosenthal (57) ABSTRACT

A solid state image sensor is provided with a primary first-conductivity-type semiconductive region which serves as a charge storage region of a photo-sensing area and a secondary first-conductivity-type semiconductive region for enlarging a charge collecting region of the photo-sensing area.

4 Claims, 7 Drawing Sheets

SOLID STATE IMAGE SENSOR

BACKGROUND OF THE INVENTION

1. Field of the Invention

The present invention relates to solid state image sensors such as CCD image sensors, CMOS image sensors, and the like.

2. Description of the Related Art

As a solid state image sensor, one type of solid state image sensor in which an excessive potential in a photo sensor area is drained to a substrate, also known as a vertical overflow drain-type solid state image sensor, is known in the art.

The vertical overflow drain-type solid state image sensor has been developed to comprise a photo-sensing area with a deeply formed depletion region so that the sensor will be sensitive even in the near-infrared region.

Figure 7:
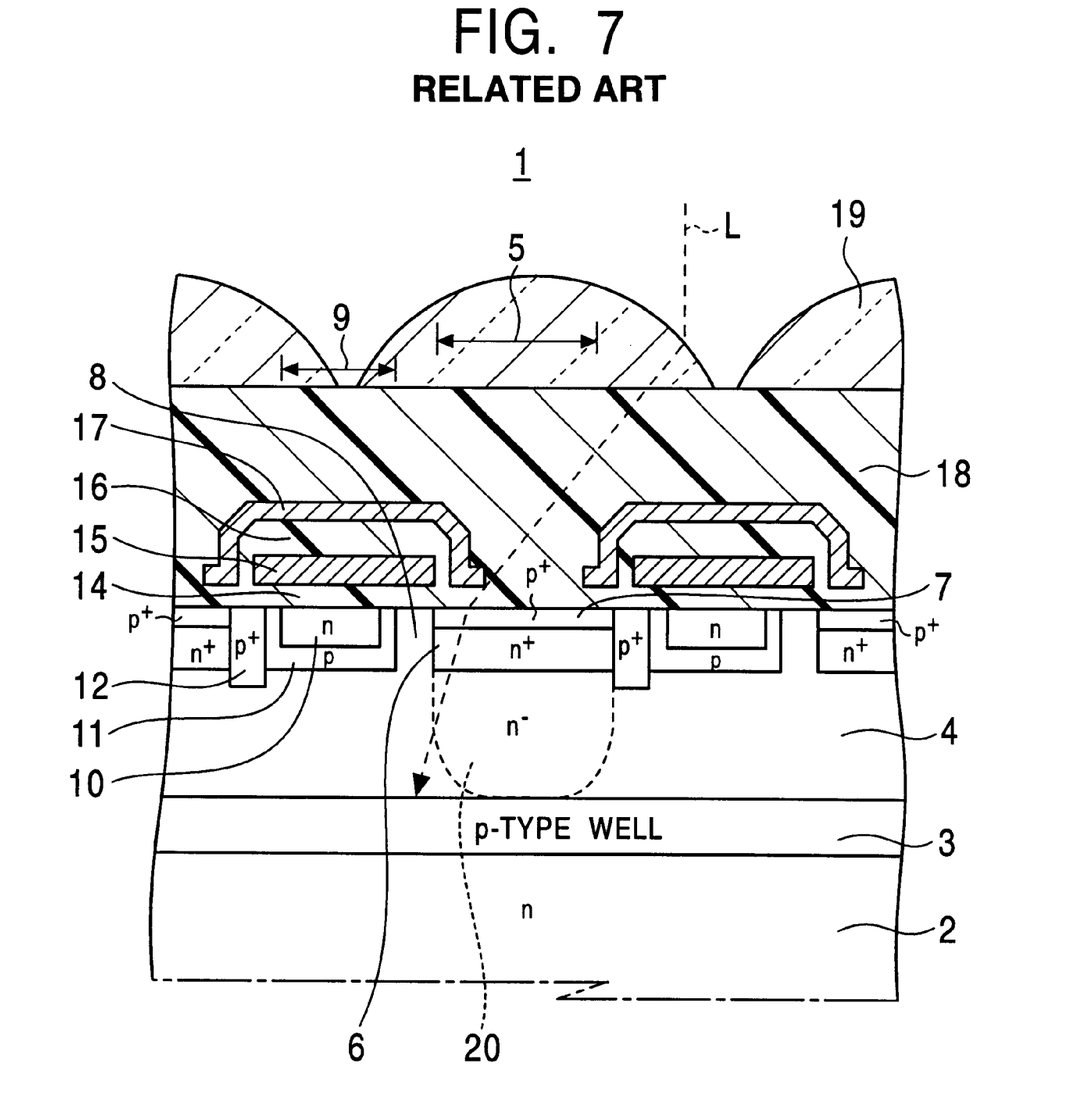
FIG. 7 is a sectional view showing the structure of a region near the pixels of a conventional CCD solid state image sensor.

FIG. 7 is a cross-section showing the structure of pixels of a conventional CCD image sensor 1, which is sensitive also in the near-infrared region.

In the CCD image sensor 1, a first semiconductive well region 3 of a second conductivity type, i.e., a p-type, which serves as an overflow barrier region is formed on a semiconductive substrate 2 formed by silicon of a first conductivity type, for example, an n-type. On the first p-type semiconductive well region 3, a high-resistance region 4 having high specific resistance, such as a $p^-$-region, an undoped region, an $n^-$-region, or the like, is formed.

On the surface of the high-resistance region 4, an $n^+$-type semiconductive region 6 and a $p^+$ positive charge storage region 7 on the $n^+$-type semiconductive region 6 are formed so as to constitute a photo-sensing area 5, a plurality of which are arrayed in a matrix. The $p^+$ positive charge storage region 7 inhibits dark current due to the energy level at the interface. The $n^+$-type semiconductive region 6 functions as a charge storage region. In the high-resistance region 4 beneath the $n^+$-type semiconductive region 6, an $n^-$-type semiconductive region 20 having a higher dopant concentration than that in the high-resistance region 4 is formed. The $n^-$-type semiconductive region 20 extends from the $n^+$-type semiconductive region 6 toward the first p-type semiconductive well region 3, also referred to as the overflow barrier region 3, and functions as a charge collecting region. The region in the photo-sensing area 5 which performs photoelectric conversion comprises the $n^+$-type semiconductive region 6 and the $n^-$-type semiconductive region 20 which is a portion of a depletion region extending downwardly from the $n^+$-type semiconductive region 6 toward the substrate and which is a portion above the overflow barrier region 3.

An n-type buried transfer channel region 10 of a vertical transfer register 9 is formed in the high-resistance region 4, at a position corresponding to one side of a row of photosensors. A read-out gate region 8 is provided between the vertical transfer register 9 and the photo-sensing area 5. A second p-type semiconductive well region 11 is formed to surround the buried transfer channel region 10. A p-type channel stop region 12 is formed to separate pixels each of which includes the photo-sensing area 5.

On the buried transfer channel region 10, the channel stop region 12, and the read-out gate region 8, a transfer electrode 15 comprising, for example, polycrystalline silicon, is formed with a gate insulating layer 14 therebetween. The buried transfer channel region 10, the gate insulating layer 14, and the transfer electrode 15 constitute the vertical transfer register 9 having a CCD structure. A light-shielding layer 17 of, for example, aluminum, is formed on an interlayer insulating layer 16 covering the transfer electrode 15 and over the entire region other than an opening of the photo-sensing area 5.

An on-chip lens 19 for focussing incident light in the photo-sensing area 5 is formed at a position corresponding to each photo-sensing area 5 and is separated from thelight shielding layer 17 by a planarization layer 18 and a color filter (not shown).

In this CCD image sensor 1, the region extending from the $n^+$-type semiconductive region 6 to the $n^-$-type semiconductive region 20, i.e., the region which includes the $n^+$-type semiconductive region 6 and the depletion layer extending from the $n^+$-type semiconductive region 6 to the overflow barrier region 3, performs photoelectric conversion and collects charge. Generally, much of the light entering the photo-sensing area 5 is oblique due to the on-chip lens 19 used for focussing.

An incident path of light L is shown in FIG. 7. The light L entering the photo-sensing area 5 initially passes through the $n^-$-type semiconductive region 20 of the photo-sensing area 5. However, in the region under the transfer electrode 15, although the overflow barrier region 3 is yet to be reached, the charge generated by the photoelectric conversion is drained to the substrate 2 without being accumulated in the $n^+$-type semiconductive region 6.

This is because the focussing structure for the photo-sensing area does not take into consideration the oblique rays entering the photo-sensing area 5. Recently, the condensing rate has been increased by adding internal layer lenses, increasing the oblique rays. Under these circumstances, significant portion of the condensed light is discarded, causing the sensitivity to decrease.

SUMMARY OF THE INVENTION

Accordingly, it is an object of the present invention to provide a solid state image sensor with improved sensitivity, in which the charge obtained from oblique rays by photoelectric conversion is collected efficiently.

A solid state image sensor according to the present invention comprises a primary first-conductivity-type semiconductive region which serves as a charge storage region of a photo-sensing area, and a secondary first-conductivity-type semiconductive region, formed under the primary first-conductivity-type semiconductive region, for enlarging a charge collecting region of the photo-sensing area.

Because the secondary first-conductivity-type semiconductive region is provided under the primary first-conductivity-type semiconductor region serving as a charge storage region, the charge collecting region is enlarged horizontally and vertically. Thus, light entering the photo-sensing area at an oblique angle can also be collected and the sensitivity thereof can be efficiently enhanced.

Preferably, the secondary first-conductivity-type semiconductive region is larger than the photo-sensing area. In this configuration, the charge collecting region can be further expanded and the sensitivity can be improved.

Preferably, the solid state image sensor further comprises an isolation region for isolating the secondary first-conductivity-type semiconductive region. In this configuration, the depletion layer is inhibited from extending to the adjacent pixel, thereby preventing blooming.

DESCRIPTION OF THE PREFERRED EMBODIMENTS

A solid state image sensor of the present invention is configured to include a first-conductivity-type semiconductive region (primary first-conductivity-type semiconductive region) which serves as a charge storage region of a photo-sensing area, and an additional first-conductivity-type semiconductive region (secondary first-conductivity-type semiconductive region) formed under the above-described first-conductivity-type semiconductive region so as to expand a charge collecting region.

Preferably, the secondary first-conductivity-type semiconductive region is formed to have an area greater than that of the photo-sensing area.

More preferably, an isolation region for isolating the secondary first-conductivity-type semiconductive region is formed.

Figure 1:
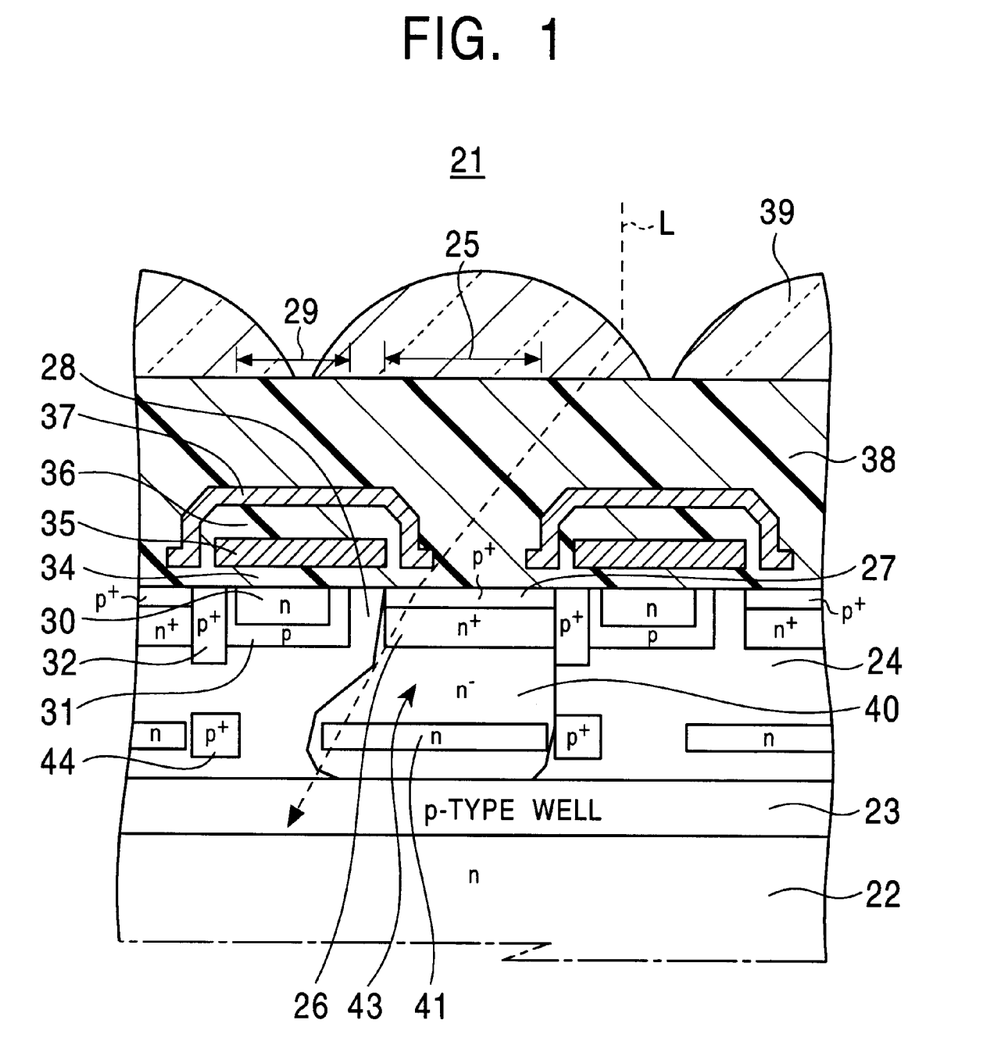
FIG. 1 is a sectional view showing the structure of a region near the pixels of a solid state image sensor according to an embodiment of the present invention applied to a CCD image sensor.
Figure 2:
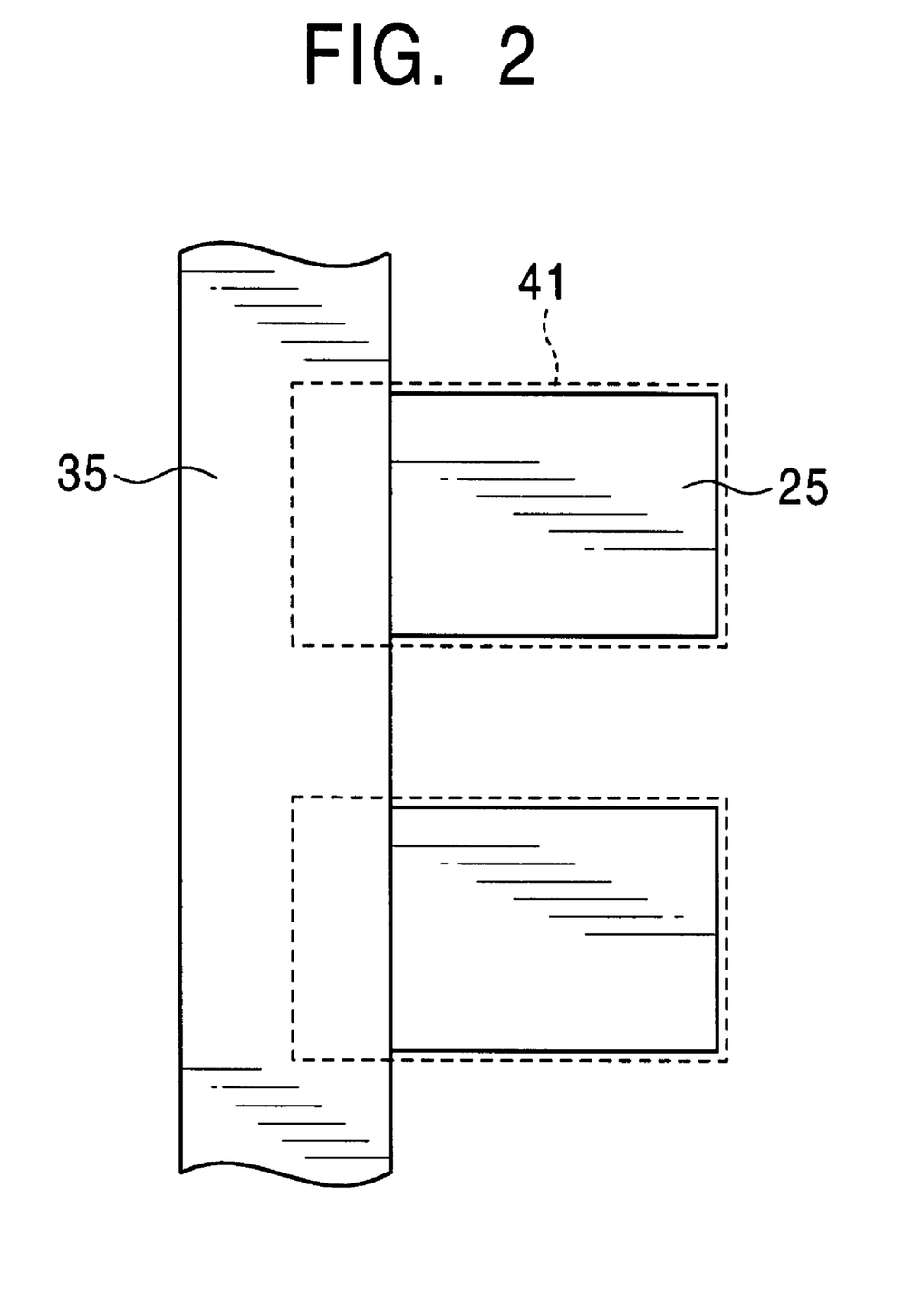
FIG. 2 is a schematic plan view of the embodiment shown in FIG. 1.

FIGS. 1 and 2 show a solid state image sensor 21 according to one embodiment of the present invention. The solid state image sensor is applied to a CCD solid state image sensor in this embodiment.

The CCD solid state image sensor 21 comprises a semiconductive substrate 22 made of silicon of a first-conductivity-type, for example, n-type, and a first conductive well region 23 of a second-conductivity-type, i.e., p-type, which serves as an overflow barrier region and which is formed on the semiconductive substrate 22. On the first p-type semiconductive well region 23, a high-resistance region 24 having high specific resistance, such as a p$^-$-region, an undoped region, an n$^-$-region, or the like, is formed.

On the surface of the high resistance region 24, an n$^+$-type semiconductive region 26 and a p$^+$ positive charge storage region 27 on the top of the n$^+$-type semiconductive region 26 constitute a photo-sensing area 25, a plurality of which are arrayed in a matrix. The p$^+$ positive charge storage region 27 inhibits dark current due to the energy level at the interface. The n$^+$-type semiconductive region 26 functions as a charge storage region. In the high-resistance region 24 beneath the n$^+$-type semiconductive region 26, an n$^-$-type semiconductive region 40 having a higher dopant concentration than that in the high-resistance region 24 is formed. The n$^-$-type semiconductive region 40 extends from the n$^+$-type semiconductive region 26 toward the first p-type semiconductive well region 23, also referred to as the overflow barrier region 23, and functions as a charge collecting region.

An n-type buried transfer channel region 30 of a vertical transfer register 29 is formed in the high-resistance region 24 at a position corresponding to one side of a row of photo-sensors across a read-out gate region 28. A second p-type semiconductive well region 31 is formed to surround the buried transfer channel region 30. A p-type channel stop region 32 is formed to separate pixels each of which includes the photo-sensing area 25.

On the buried transfer channel region 30, the channel stop region 32, and the read-out gate region 28, a transfer electrode 35 comprising, for example, polycrystalline silicon, is formed with a gate insulating layer 34 therebetween. The buried transfer channel region 30, the gate insulating layer 34, and the transfer electrode 35 constitute the vertical transfer register 29 having a CCD structure. A light-shielding layer 37 of, for example, Al, is formed to cover the region portion except for the opening of the photo-sensing area 25. An interlayer insulating layer 36 is formed at the upper surface of the transfer electrode 35 and separates the transfer electrode 35 from the light shielding layer 37.

Furthermore, a so-called on-chip lens 39 for focussing incident light into the photo-sensing area 25 is formed at a position corresponding to each photo-sensing area 25 and is separated by a planarization layer 38 and a color filter (not shown).

In this embodiment, a secondary n-type semiconductive region 41 is additionally formed at a position under the n$^+$-type semiconductive region 26 which serves as the charge storage region of the photo-sensing area 25 and above the first p-type semiconductive well region 23 which serves as the overflow barrier region. The n-type semiconductive region 41 is formed to be wider than the n$^+$-type semiconductive region 26 and extends past the read-out gate region 28 and under the vertical transfer register 29.

The dopant concentration of the secondary n-type semiconductive region (hereinafter referred to as the n-type semiconductive region) 41 is set to be lower than that of the n$^+$-type semiconductive region 26, for example, half the dopant concentration of the n$^+$-type semiconductive region 26 or less, and is higher than the dopant concentration of the n$^-$-type semiconductive region 40. This is because the region which stores the charge needs to be in the same position as the n$^+$-type semiconductive region 26 in order to read-out the charge. By setting the dopant concentration as above, the depth of the potential profile gradually increases from the n-type semiconductive region 41 to the n$^+$-type semiconductive region 26.

It should be noted here that the n-type semiconductive region 41 may comprise two portions, that is, the portion under the vertical transfer register 29 and the portion under the n$^+$-type semiconductive region 26, having different dopant concentrations, as long as the entire n-type semiconductive region 41 is integrated from the point of view of electrical potential.

The depth at which the n-type semiconductive region 41 is formed may be any depth in the region above the first p-type semiconductive well region 23 as long as the barrier provided by the second p-type semiconductive region 31 which serves as an overflow barrier of the vertical transfer register 29 is not broken. In other words, the n-type semiconductive region 41 may overlap part of the second p-type semiconductive well region 31 but should be placed with a sufficient depth so as not to break the potential barrier. When a saturation level of charge in the photo-sensing area 25 is fixed to a predetermined level, the deeper the position of the n-type semiconductive region 41, the lower the required dopant concentration.

The region which performs photoelectric conversion in the photo-sensing area 25 comprises the $n^+$-type semiconductive region 26, the $n^-$-type semiconductive region 40, which is a portion above the overflow barrier region 23 in the depletion layer which extends downwardly from the $n^+$-type semiconductive region 26 to the substrate, and the n-type semiconductive region 41.

In this embodiment, a secondary p-type channel stop region 44 which serves as an isolation region is formed in the portion below the second p-type semiconductive well region 31 and the primary p-type channel stop region 32 at substantially the same depth as the n-type semiconductive region 41.

According to this embodiment, because the n-type semiconductive region 41 is formed deep under the $n^+$-type semiconductive region 26 and extends under the vertical transfer register 29, the charge collecting region 43 extends to the portion under the vertical transfer register 29. In this manner, the likelihood of light which enters at an oblique angle passing through the charge collecting region 41 of the photo-sensing area 25 is increased, thereby collecting charges which would otherwise be drained and enhancing the sensitivity of the sensor.

Since the charge collecting region 43 comprising the n-type semiconductive region 41 extends to the portion under the vertical transfer register 29, the depletion layer would also extend to the adjacent photo-sensing area 25, causing blooming.

However, in this embodiment, because the secondary p-type channel stop region 44 is formed at the same depth as the n-type semiconductive region 41 in the portion below the second p-type semiconductive well region 31 and the primary p-type channel stop region 32, a potential barrier is formed so as to securely prevent blooming. By providing the secondary p-type channel stop region 44, the n-type semiconductive region 41 can be formed to extend and project toward the portion under the second p-type semiconductive well region 31, thereby maximizing the charge collecting region.

Furthermore, when the secondary p-type channel region 44 has an increased dopant concentration, the n-type semiconductive region 41 can be further extended to the region near the p-type channel stop region 44.

Figure 3:
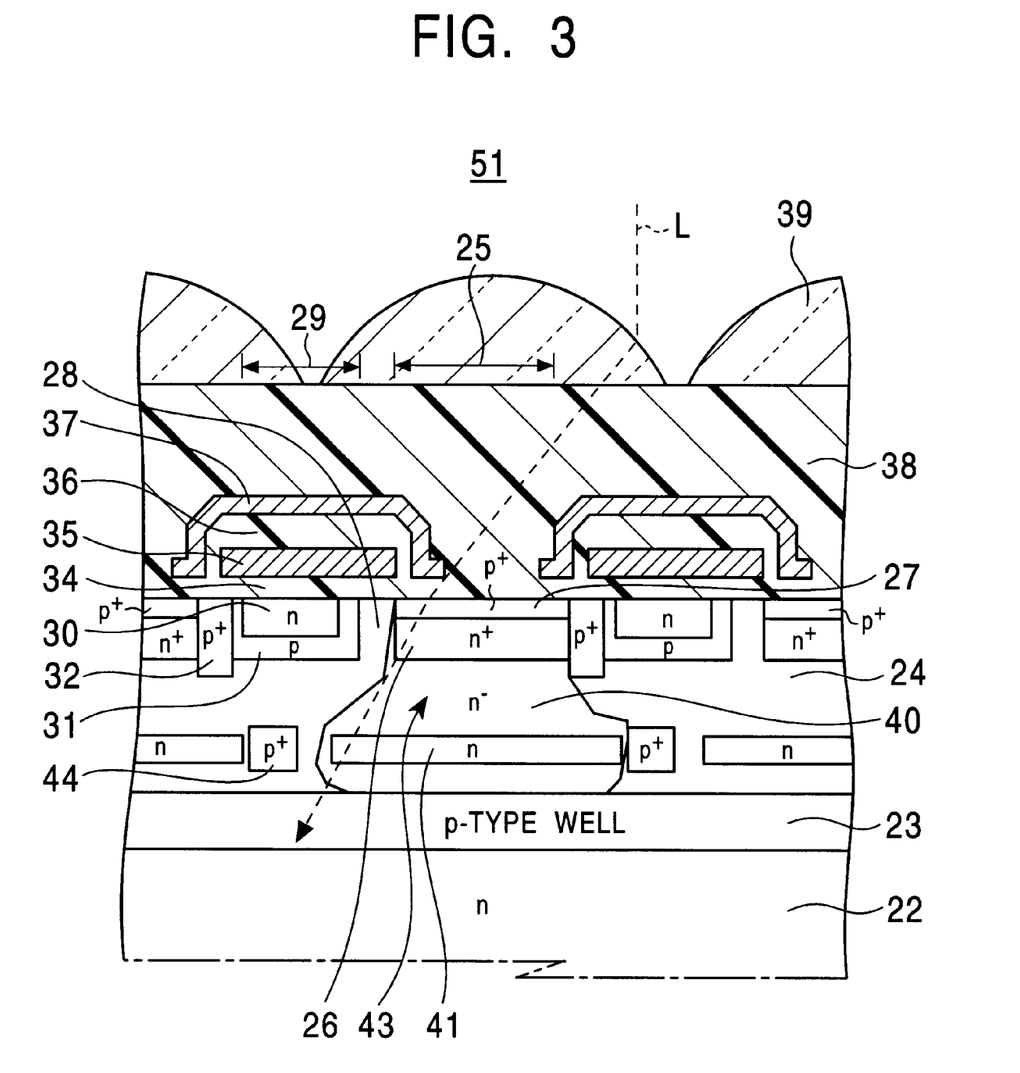
FIG. 3 is a sectional view showing the structure of a region near the pixels of a solid state image sensor according to another embodiment of the present invention applied to a CCD image sensor.

FIG. 3 shows an image sensor according to another aspect of the present invention. This embodiment also concerns a CCD image sensor.

Although the previous embodiment has the n-type semiconductive region 41 extending toward the read-out gate region 28 and to the region under the vertical transfer register 29, the n-type semiconductive region 41 may also be formed to extend in the opposite direction, i.e., toward the vertical transfer register 29 of the adjacent pixel.

For enlarging the charge collecting region 43, a CCD solid state image sensor 51 of the present embodiment comprises the n-type semiconductive region 41 which extends toward the gate region 28 and to the region under the vertical transfer register 29, and also toward the opposite portion under the vertical transfer register 29 of the adjacent pixel.

In this case, the secondary p-type channel stop region 44 for preventing blooming is formed in a portion under the second p-type semiconductive well region 31, and is kept sufficiently short so as not to overlap the read-out gate region 28 of the adjacent pixel.

The other components are the same as the embodiment shown in FIG. 1. Thus corresponding parts are represented by the same reference numerals and a description there of is omitted.

According to this CCD solid state image sensor 51, because the n-type semiconductive region 41 is formed to extend in two opposite direction from the photo-sensing region 25, the charge collecting region 43 can be enlarged as in the previous embodiment, and the likelihood of light which enters at an oblique angle passing through the charge collecting region 43 is increased. Thus, the charge which would otherwise be drained can be collected and the sensitivity of the sensor can be improved.

As described in FIGS. 1 and 3, when the n-type semiconductive region 41 of the photo-sensing area 25 is at least formed to extend horizontally relative to the opening of the pixel at a position deeper than the $n^+$-type semiconductive region 26 and above the first p-type semiconductive well region 23, the charge collecting region 43 can be enlarged horizontally, as well as in the direction perpendicular to the plane of the drawing, resulting in an enhanced sensitivity.

Although the above-described embodiment comprises a hole accumulation diode sensor (HAD sensor) having the $p^+$ positive charge storage region 27 as the photo-sensing area 25, the present invention may be applied to other configurations such as one employing a photodiode comprising the $n^+$-type semiconductive region 26 without the $p^+$ positive charge storage region 27, the $n^-$-type semiconductive region 40, and the first p-type semiconductive well region 23.

The present invention can be applied to a wide variety of CCD solid state image sensors each having an overflow barrier region 23, and pixels of various sizes, large and small.

Figure 4A:
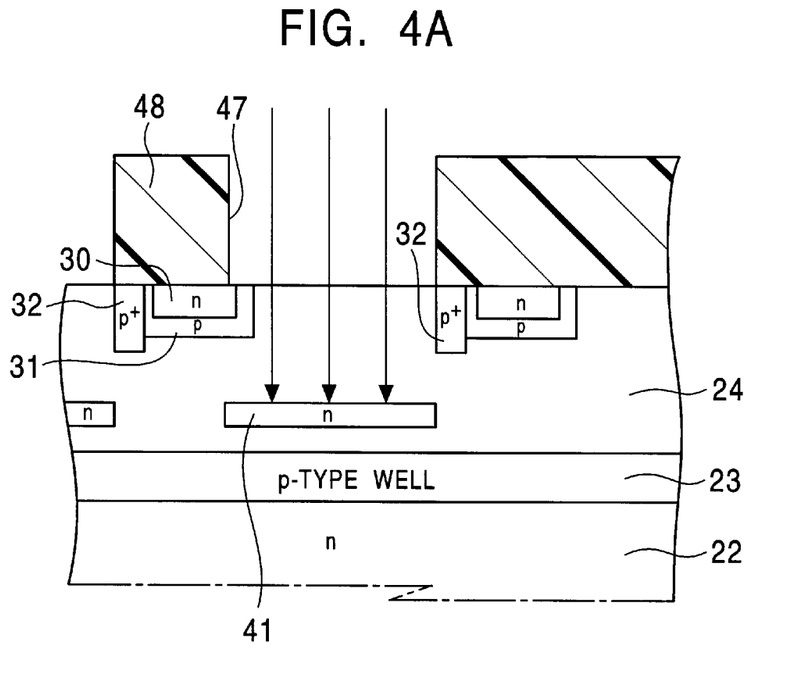
FIG. 4A is a sectional view explaining an embodiment of a method for manufacturing a CCD solid state image sensor of the present invention.
Figure 4B:
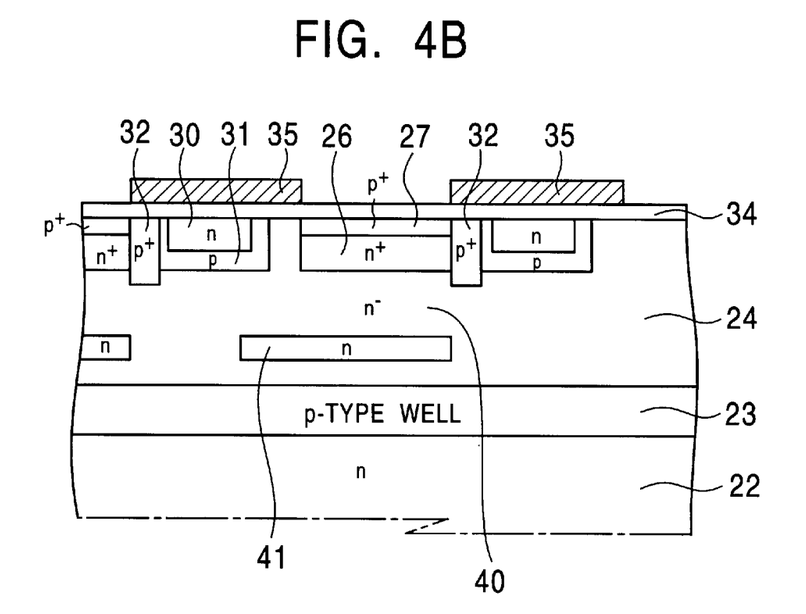
FIG. 4B is a sectional view explaining the embodiment of the method for manufacturing the CCD solid state image sensor of the present invention.

FIGS. 4A and 4B are sectional views explaining an embodiment of a method for manufacturing the above-described CCD solid state image sensor 21.

As shown in FIG. 4A, the first p-type semiconductive well region 23 is formed on the semiconductive substrate 22, and the buried transfer channel 30, the second p-type semiconductive well region 31, the primary p-type channel stop region 32, and so forth, are formed in the high-resistance region 24 on the p-type semiconductive well region 23. Alternatively, the first p-type semiconductive well region 23 may be formed on the surface of the semiconductive substrate 22, and then the high-resistance region 24 may be formed on the first p-type semiconductive well region 23. Alternatively, the first p-type semiconductive well region 23 may be formed in the semiconductive substrate 22 so that the region in the substrate above the first semiconductive well region 23 can be used as the high-resistance region 24.

Next, during the step prior to the formation of the transfer electrode 35, i.e., before the $n^+$-type semiconductive region 26 and the $p^+$ positive charge storage region 27 of the photo-sensing area 25 are formed by a self aligning process, a resist mask 48 having an opening 47 corresponding to the desired position of the n-type semiconductive region 41 is formed. Then the n-type semiconductive region 41 is formed through the resist mask 48, at a position deeper than the $n^+$-type semiconductive region 26 and above the first p-type semiconductive well region 23, by ion-implantation of an n-type dopant such as arsenic (As), phosphorous (P), etc. For example, when the pixel size is 5 μm and the first p-type semiconductive well region 23 is formed at a depth of 2.5 μm, the n-type semiconductive region 41 is implanted at the depth of approximately 1 μm and approximately $5 \times 10^{11}$/cm². Since this value is determined by the overall electrical potential derived from the depth of the first p-type semiconductive well region 23, the amount of dopant in the n⁺-type semiconductive region 26 and the size of the pixel, no general description can be made.

Next, as shown in FIG. 4B, the n⁺-type semiconductive region 26 and the p⁺ positive charge storage region 27 of the photo-sensing area 25 are formed. Subsequently, the gate insulating layer 34 and the transfer electrode 35 are formed. The steps following the above-described steps are the same as in the standard process and the explanation thereof is omitted.

In the process shown in FIGS. 4A and 4B, it is assumed that the n-type semiconductive region 41 is formed by ion implantation prior to the formation of the transfer electrode 35. Alternatively, the n-type semiconductive region 41 may be formed at a deep position after the formation of the transfer electrode 35 by performing the ion implantation through the transfer electrode 35. The n-type semiconductive region 41 may also be formed after the formation of the n⁺-type semiconductive region 26 and p⁺ positive charge storage region 27 and prior to the formation of the transfer electrode 35 by means of ion plantation.

Figure 5A:
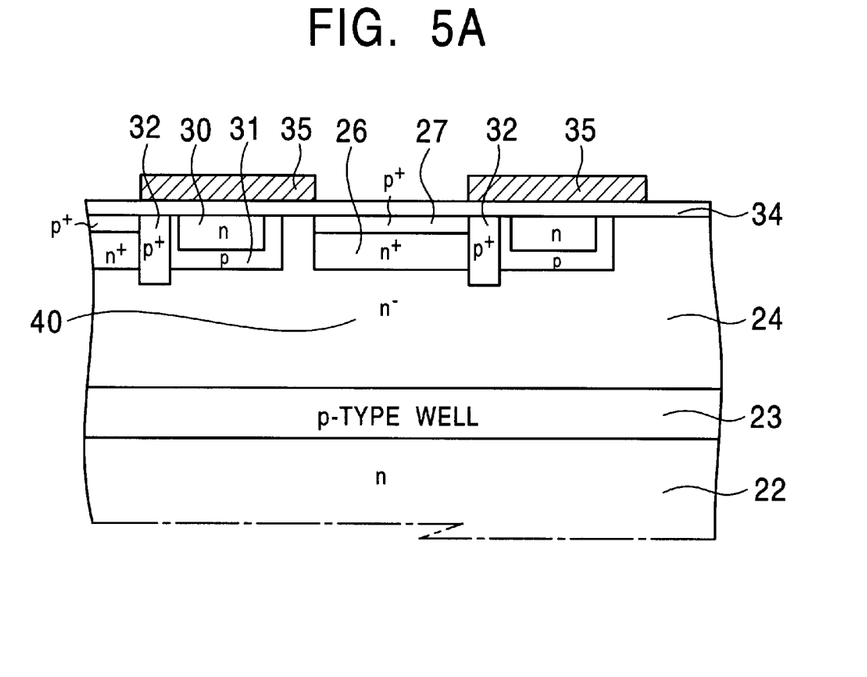
FIG. 5A is a sectional view explaining another embodiment of a method for manufacturing a CCD solid state image sensor of the present invention.
Figure 5B:
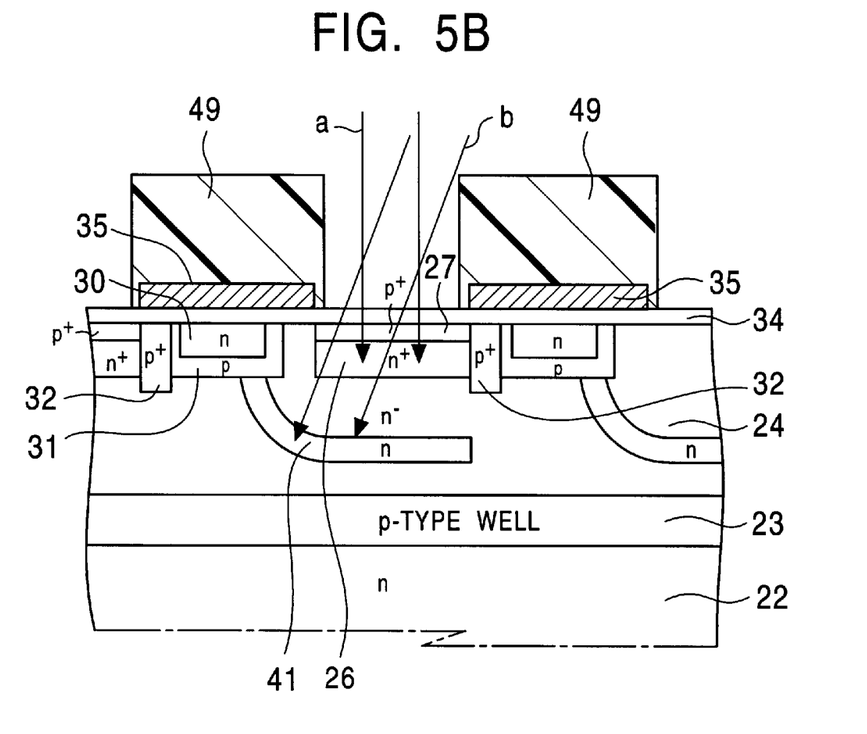
FIG. 5B is a sectional view explaining the embodiment of a method for manufacturing the CCD solid state image sensor of the present invention.

FIGS. 5A and 5B are sectional views explaining another embodiment of a method for manufacturing an embodiment of a CCD solid state image sensor.

As shown in FIG. 5A, the first p-type semiconductive well region 23 is formed on the semiconductive substrate 22, and the buried transfer channel 30, the second p-type semiconductive well region 31, the primary p-type channel stop region 32, and so forth, are formed in the high resistance region 24 on the p-type semiconductive well region 23. The p⁺ positive charge storage region 27, the gate insulating layer 34, and the transfer electrode 35 are also formed.

Next, as shown in FIG. 5B, the n⁺-type semiconductive region 26 of the photo-sensing area is formed through a resist mask 49 by performing ion implantation of an n-type dopant a. Using the same resist mask 49, the n-type semiconductive region 41 is formed at a position deeper than the n⁺-type semiconductive region 26 and above the first p-type semiconductive well region 23, by ion-implantation of an n-type dopant b, for example, arsenic (As), phosphorous (P), etc., at an oblique angle so that the n-type semiconductive region 41 extends from the photo-sensing area 25 to the portion below the vertical transfer register 29.

When the n-type semiconductive region 41 is formed after the formation of the transfer electrode 35 by using the same resist mask 49 as that used in forming the n⁺-type semiconductive region 26, the n-type semiconductive region 41 can be formed by ion-implantation at an implantation angle of 7 degrees or more for inhibiting channeling so that the n-type semiconductive region 41 can extend to the portion directly below the vertical transfer register 29. In this case, when the n-type semiconductive region 41 is formed, because dopant ions penetrate the resist mask 49 and are implanted in the direction of the second p-type semiconductive well region 31 due to the above-described implantation angle and the profile of the resist mask 49, blooming may occur. In order to prevent blooming, it is necessary to inhibit the blooming in the part around the read-out gate region 28 by treatment such as increasing the dopant concentration in the second p-type semiconductive well region 31, etc.

Next, an embodiment of a method for forming the secondary p-type channel stop region 44 will be described.

The simple way is to form the secondary p-type channel stop region 44 directly below the primary p-type channel stop region 32 by using an increased implantation energy during the ion implantation process for forming the primary p-type channel stop region 32.

While the ion implantation for forming the primary p-type channel stop region generally employs a thin resist mask since the line width of the mask opening is small, a thicker resist mask is required in forming the secondary p-type channel stop region which requires a relatively high implantation energy; thus, it is practical to conduct the ion implantation for forming the secondary p-type channel stop region 44 by using a different resist mask.

Preferably, the doze of a p-type dopant, for example, boron (B), is approximately in the order of $10^{11}$ to $10^{13}$/cm² so that the effect of the n-type semiconductive region 41 can be cancelled. The implantation energy may be set so that the implanting range $R_p$ will be substantially the same as the depth of the n-type semiconductive region 41.

According to the manufacturing process of this embodiment, merely by adding an ion implantation step for forming n-type semiconductive region 41 to the conventional manufacturing process, a CCD solid state image sensor with high sensitivity can be manufactured at reduced cost.

Figure 6:
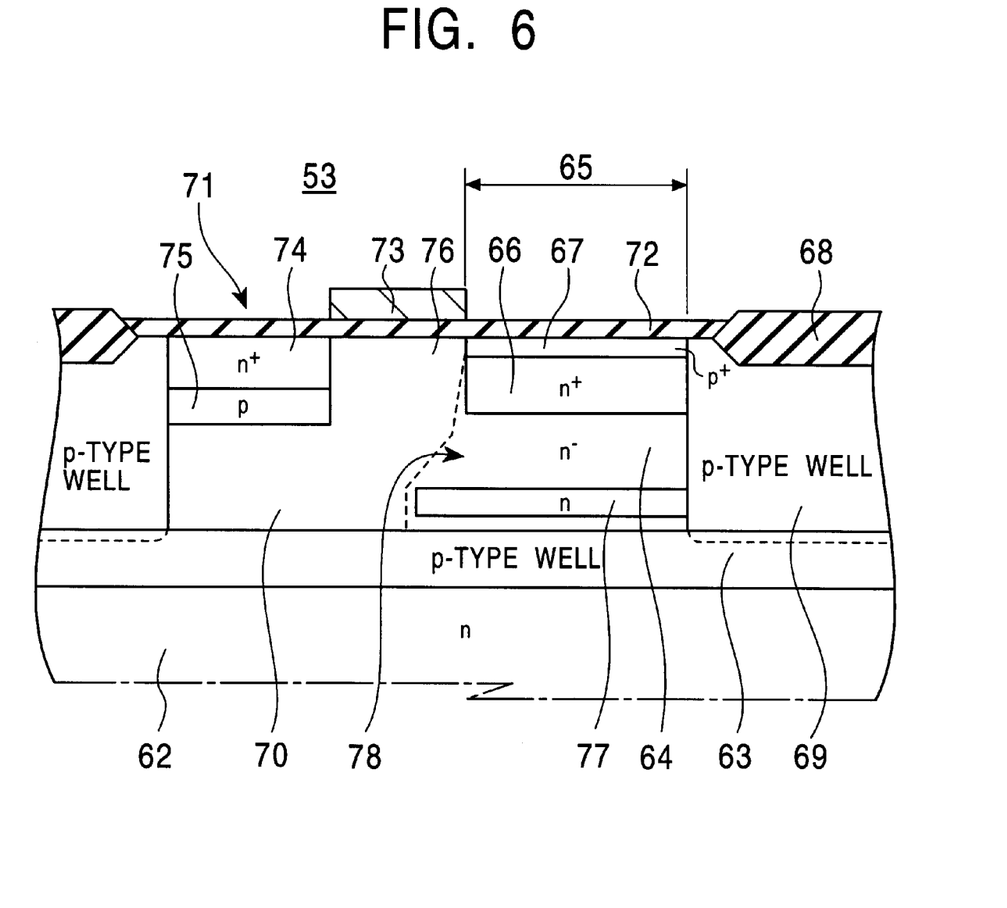
FIG. 6 is a sectional view showing the structure of a region near the pixels of a solid state image sensor according to yet another embodiment of the present invention applied to a CMOS solid state image sensor.

FIG. 6 is a sectional view of a solid state image sensor according to yet another embodiment of the present invention. Here, the present invention is applied to a CMOS solid state image sensor. FIG. 6 shows a portion around a pixel comprising a photodiode which serves as a photo-sensing area, and a MOS transistor for read-out.

In the CMOS solid state image sensor 53 of this embodiment, a silicon semiconductive substrate 62 of first-conductivity-type, for example, n-type and a first semiconductive well region 63 of a second-conductivity-type, i.e., p-type, which serves as an overflow barrier region are formed on the substrate 62. On the first p-type semiconductive well region 63, a high-resistance region 70 having specific resistance, such as a p⁻-region, an n⁻-region, or the like is formed.

On the surface of the high-resistance region 70, a field insulating layer 68 for separating pixels arrayed in a matrix is formed. Under the field insulating layer 68, a second p-type semiconductive well region 69 is formed to extend toward the first p-type semiconductive well region 63. The second p-type semiconductive well region 69 is formed to extend from the edge of the field insulating layer 68 toward an active region.

In the high-resistance region 70 of each pixel, a photodiode 65 and a read-out MOS transistor 71 are formed. The photodiode 65 comprises a p⁺ positive charge storage region 67 on the surface, an n⁺-type semiconductive region 66 serving as a charge storage region, an n⁻-type semiconductive region 64 disposed under the region 66, and the p-type semiconductive well regions 63 and 69. The n⁻-type semiconductive region 64 serves as a charge collecting region.

The read-out MOS transistor 71 comprises a gate electrode 73 composed of, for example, polycrystalline silicon, a source/drain region 74, and the n⁺-type semiconductive region 66 of a photo-sensing area which serves as the other source/drain region. A gate insulating layer 72 is provided between the gate electrode 73 and the source/drain region 74. A p-type semiconductive region 75 is formed under the source/drain region 74. In a channel region 76 under the gate electrode 73, an appropriate dopant is introduced as necessary (for example, for controlling $V_{th}$).

In this embodiment, a secondary n-type semiconductive region (hereinafter referred to as n-type semiconductive region) 77 is particularly formed at a position in the n⁻-type semiconductive region 64 deeper than the n⁺-type semiconductive region 66 of the photodiode 65 and above the first p-type semiconductive well region 63 which serves as an overflow barrier region. The n-type semiconductive region 77 is formed to be wider than the n⁺-type semiconductive region 66 and extends under the gate electrode 73 in this embodiment.

The dopant concentration in the n-type semiconductive region 77, as in the above, may be lower than that in the n⁺-type semiconductive region 66, for example half the concentration of the region 66 or less, and higher than the dopant concentration of the n⁻-type semiconductive region 64.

The region which performs photoelectric conversion in the photodiode 65 comprises the n⁺-type semiconductive region 66, the n⁻-type semiconductive region 64 which is a portion in a depletion layer extending downward from the n⁺-type semiconductive region 66 toward the substrate, above the overflow barrier region 63.

According to the present embodiment, by forming the n-type semiconductive region 77 at a deep position below the n⁺-type semiconductive region 66, and extended under the gate electrode 73, a charge collecting region 78 can be extended to the portion under the gate electrode 73. In this manner, the likelihood of light which enters at an oblique angle passing through the charge collecting region 78 of the photodiode 65 is increased, thereby collecting charges which would otherwise be drained and enhancing the sensitivity of the sensor.

The solid state image sensor of the present invention can be applied to the solid state image sensor employing the vertical overflow drain structure and other types of the overflow drain structures, and to the pixels of various sizes, large and small.

The solid state image sensor of the present invention is suitable when applied to the solid state image sensor which is sensitive even in the near-infrared region and in which the depletion region of the photo-sensing area is deeply formed.

The solid state image sensor of-the present invention is not limited by the above-described embodiments, and various configurations are possible without departing from the spirit of the present invention.

What is claimed is:

1. A solid state image sensor, comprising:
    an overflow barrier region of a second-conductivity-type semiconductor;
    a photo-sensing area of a first-conductivity-type semiconductor on said overflow barrier region; wherein,
    said photo-sensing area comprises a first region having a first dopant concentration, a second region under said first region having a second dopant concentration smaller than said first dopant concentration, and a third region under said second region having a third dopant concentration between said first and second depant concentrations.

2. The solid state image sensor according to claim 1, wherein said third region is wider than said first region.

3. A solid state image sensor according to claim 2, further comprising:
    an isolating region corresponding to a depth of said third region for isolating said third region.

4. The solid state image sensor according to claim 1, further comprising:
    an isolating region corresponding to a depth of said third region for isolating said third region.

* * * * *